United States Patent [19]

Yoshida

[11] Patent Number: 4,677,600
[45] Date of Patent: Jun. 30, 1987

[54] KEYBOARD APPARATUS

[75] Inventor: Motohiko Yoshida, Fukushima, Japan

[73] Assignee: Alps Electric Co., Ltd., Japan

[21] Appl. No.: 807,836

[22] Filed: Dec. 11, 1985

[30] Foreign Application Priority Data

Dec. 11, 1984 [JP] Japan ............................ 59-259922

[51] Int. Cl.⁴ ............................................ G01S 3/80
[52] U.S. Cl. .................................. 367/127; 367/117; 367/907; 340/365 R
[58] Field of Search ................ 367/117, 127, 907; 340/365 A, 365 R

[56] References Cited

U.S. PATENT DOCUMENTS

| | | | |
|---|---|---|---|
| 3,647,962 | 3/1972 | Whetstone | 340/365 A |
| 3,857,022 | 12/1974 | Rebane et al. | 367/117 |
| 3,976,899 | 8/1976 | Fanshawe | 340/365 A |
| 4,012,588 | 3/1977 | Davis et al. | 367/907 |
| 4,031,501 | 6/1977 | Caruso | 367/127 |
| 4,378,552 | 3/1983 | Jalbert | 367/117 |

*Primary Examiner*—Richard A. Farley
*Attorney, Agent, or Firm*—Guy W. Shoup

[57] ABSTRACT

A keyboard apparatus has a plurality of elastically deformable elastic members disposed on a board in a predetermined positional relationship, a plurality of push members each disposed above each of said plurality of elastic members and adapted to push said elastic member to cause the same to elastically deform and produce an acoustic signal. At least three pickups are disposed on the board at different positions for sensing arrival of the acoustic signal. A detecting circuit determines for detecting the keyed position in response to the output from each of the pickups based upon the differences between arrival times of the acoustic signal at these pickups.

12 Claims, 8 Drawing Figures

KEYBOARD APPARATUS

FIELD OF INVENTION

The present invention relates to a keyboard apparatus for use in electronic equipment such as a word process and a personal computer.

BACKGROUND OF THE INVENTION

A keyboard apparatus of this type is conventionally provided with a plurality of keyboard switches disposed on a board in a predetermined positional relationship, and the switches each are provided with a key-top mounted thereon, wherein it is adapted such that depression of one key-top out of the plurality of key-tops causes a movable contact in the switch to come in contact with a fixed contact, in the switch, and the contact therebetween allows a keyed signal to be output to the host side to operate electronic equipment.

Since the keyboard apparatus of the conventional type has been provided with a plurality of switches each having a movable contact and a fixed contact, which are adapted to make an electrical contact therebetween, such an apparatus has often created a problem hindering the operation thereof when dirt or the like attaches to the contacts to produce a bad contact therebetween and this reduces reliability of any keyboard operation. Such an apparatus has also had such a problem that it requires a large number of movable and fixed contacts, which has increased the number of the component parts used therein and raised the cost of the production.

SUMMARY OF THE INVENTION

To solve the problems described above, the keyboard apparatus of the invention is provided with a plurality of elastically deformable elastic members disposed on a board in a predetermined positional relationship and a push member disposed above each of the elastic members and adapted to push the elastic member to cause it to elastically deform and produce a keyed signal, and the keyboard apparatus is further provided with at least three pickups disposed on the board at different positions for sensing the keyed signal and a detecting circuit which in response to the output from each of the pickups will detect the keyed position based upon the difference between the arrival times of the keyed signal at these pickups.

According to such means, when a push member out of the plurality of push members is pressed down and an elastic member is caused to make an elastic deformation, a keyed signal is produced at the keyed position. Then, the keyed signal is propagated to be input to each of the pickups, when there are produced differences between times of arrival of the signal at these pickups due to the relative positions between the keyed position and the respective pickups. Since such data are input to the detecting circuit, the keyed position can be detected by the circuit based upon the time differences.

BRIEF DESCRIPTION OF THE DRAWINGS

The invention will now be further described with reference to the accompanying drawings, of which:

FIGS. 1 to 5 are drawings for showing a first preferred embodiment of the keyboard apparatus of the present invention, in which:

FIG. 1 is a cross-sectional view showing an essential portion of the apparatus;

FIG. 2 is a perspective view showing a general appearance of the apparatus;

FIG. 3 is a perspective view showing a plate spring;

FIG. 4 is a block diagram for showing the three pickups and a detecting circuit; and FIG. 5 is a block diagram showing internal structure of a controller;

FIGS. 6 and 7 are drawings for showing a second preferred embodiment of the invention, in which:

FIG. 6 is a cross-sectional view corresponding to FIG. 1; and

FIG. 7 is a perspective view of a plate spring; and

DETAILED DESCRIPTION

Figure 1:
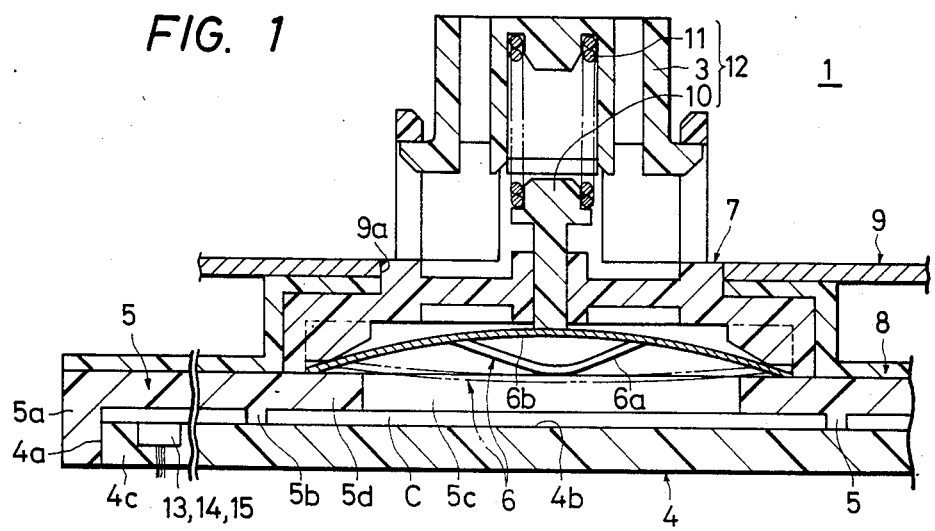
Figure 2:
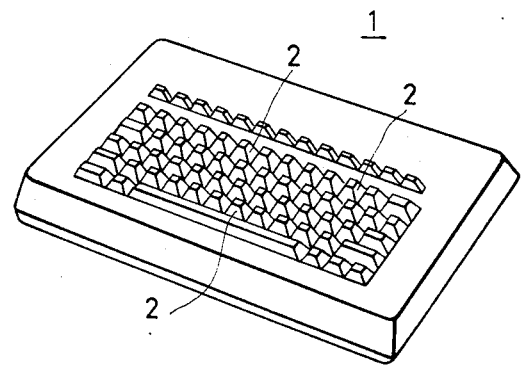

To describe the structure of the first preferred embodiment, reference is made to FIG. 2 which shows an external view of a keyboard apparatus 1. In the apparatus 1, there are a large number of key-tops disposed in a predetermined positional relationship. Each of the key-tops 2 is adapted to be mounted in a stem 3 as shown in FIG. 1. (The manner of the mounting is not shown.)

Figure 3:
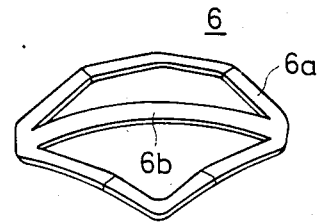

For the internal structure of the keyboard apparatus 1, reference is now made to FIG. 1, wherein numeral reference 4 denotes a board formed of a plastic into a rectangular shape, over which board 4 at approximately a 1 mm gap C apart therefrom is disposed a cover plate 5. The cover plate 5 is also made of a plastic and formed in a similar size to the board 4, and the same is provided with a flange portion 5a at its circumferential portion to abut on the side face 4a of the board 4, and further provided with several protruded portions 5b to abut on the top face 4b of the board 4 at several positions. The cover plate 5 is further provided with a plurality of openings 5c at the positions opposing the plurality of key-tops 2, above which opening 5c is disposed a plate spring 6 serving as an elastic member. The plate spring 6 is, as shown in FIG. 3, integrally formed of a supporting portion 6a which is formed in a rhombic loop and a bridge portion 6b disposed across the supporting portion 6a passing over the center thereof, which central bridge portion 6b is adapted, when pushed downward, to be biased inside out, or reversed, and it produces a reversal click when it snaps. The plate spring 6 is disposed above the top face of the board 4 with its supporting portion 6a mounted on the circumferential portion 5d of the opening in the cover plate 5. The plate spring 6 is covered by a frame member 7, which frame member 7 and the cover plate 5 are covered by a sound insulating sheet 8 made of a rubber sheet or the like. Over the sound insulating sheet 8 is disposed a panel 9, and from an opening 9a in the panel 9 is projecting the top portion of the frame member 7. In the frame member 7 are mounted the stem 3 and a push element 10 operably for up and down motion, and coil spring 11 is interposed between the stem 3 and the push element 10. As already stated, the key-top 2 is to be mounted in the stem 3. A push member 12 is formed of the key-top 2, stem 3, push element 10, and coil spring 11, and when the key-top 2 is pressed down, the push element 10 is arranged to push the central portion 6b of the plate spring 6.

Figure 4:
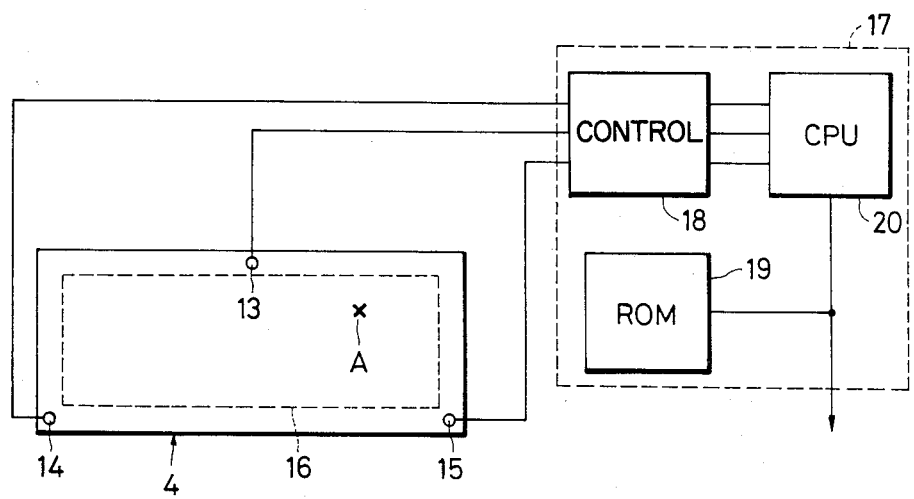

The board 4 is provided with three microminiaturized capacitor microphones 13, 14, 15, which serve as pickups for sensing the reversal click of the plate spring 6, hereafter the keyed signal. the pickups are disposed on the circumferential portion 4c of the board 4 at different positions as shown in FIG. 4 and embedded therein as shown in FIG. 1. The switch assemblies in the region 16 surrounded by a dotted line in FIG. 4, each including the plate spring 6, stem 3, and so forth as shown in FIG. 1. They are disposed in a predetermined positional relationship.

Figure 5:
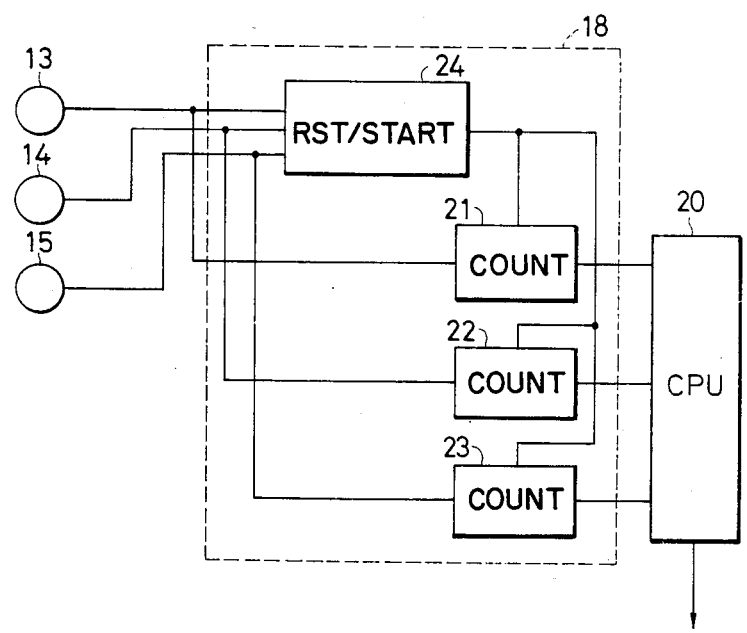

The first, second, and third capacitor microphones 13, 14, 15 are connected with a detecting circuit 17 for detecting the keyed position, or what key-top 2 was pressed down, as shown in FIG. 4. The detecting circuit 17 includes a controller 18 for detecting and outputting the differences between the times of arrival of the keyed signal (reversal click) of the plate spring 6 as it reaches the capacitor micophones 13, 14, 15. It also has a memory (ROM) 19 for storing previously the measured characteristic data on the board 4, and a central processing unit (CPU) 20 for comparing the contents in the ROM 19 with the output from the controller 18, to thereby determine the keyed position on the board 4 and output a signal representing the determined position. The controller 18 is formed, as shown in FIG. 5, of first, second, and third clock counters 21, 22, 23 connected with the capacitor microphones 13, 14, 15, respectively, and a reset-start circuit 24 for resetting and starting the first, second, and third clock counters 21, 22, 23.

Operation of the keyboard apparatus will now be described now. First, when one key-top 2 out of the plurality of key-tops is depressed, the push element 10 is pressed down via the stem 3 and the coil spring 11. Hence, the central bridge portion 6b of the plate spring 6 is pushed downward by the push element 10, whereby the plate spring 6 snaps into reversed position as shown by a two-dot chain line in FIG. 1 and at this moment produces a reversal click (keyed signal). This click is propagated through the gap C between the board 4 and the cover plate 5 to be sensed by the capacitor micorphones 13, 14, 15.

Supposing the position of the actuated key-top 2 is A as shown in FIG. 4, for example, the reversal click propagating from the position A is first sensed by the first capacitor microphone 13, closest to the point A, and the click is thereby converted into an electrical signal which is input to the controller 18 of the detecting circuit 17. Then, by this signal from the first capacitor microphone 13, the reset-start circuit 24 is triggered and all the clock counters 21, 22, 23 are reset and started to count. Simultaneously, the signal from the first capacitor microphone 13 is also input to the first clock counter 21 thereby to stop its counting. Namely, the count value of the first clock counter 21 connected with the capacitor microphone closest to the keyed position, or the first capacitor microphone 13 in the present case, is held at "0". The second and third clock counters 22, 23 keeping counting with the time point when the clock counter 21 was stopped taken as the reference point, and when the keyed signal is input to the third capacitor microphone 15, located next closest to the keyed position, the third clock counter 23 is stopped by the output from the microphone 15. Thus, a count value corresponding to the difference between the arrival times at the first capacitor microphone 13 and the third capacitor microphone 15 of the keyed signal produced at the position A can be obtained. And when, finally, the keyed signal is input to the second capacitor microphone 14, the farthest one, the counting by the second clock counter 22 is stopped and a count value corresponding to the difference between the arrival times of the keyed signal at the first capacitor microphone 13 and the second capacitor microphone 14 can thereby be obtained.

These count values are input to the CPU 20 and compared therein against the measured characteristic data of the board 4 which are pre-stored in the ROM 19, to determine at what position on the board 4 the keying occurred and a signal representing the determined position is output to the host side.

By the arrangement as described above, the detection of the keyed position has become possible by means of the reversal click of the plate spring 6, and the need for reliable electrical contact between the movable and fixed contacts in prior art has been eliminated. Since the apparatus of the present invention is of such a noncontact method, it is hardly affected by dirt or the like, and therefore the reliability on the keyboard operation is enhanced. And since the use of the contacts is eliminated, the number of the component parts can be reduced and the cost of production can be advantageously kept down.

By arranging for the flange portion 5a of the cover plate 5 to abut on the side face 4a of the board 4, and, further, by providing a sound insulating sheet 8, an enclosed structure is attained in the above embodiment. Therefore, the reversal click internally produced is prevented from leaking outside, and, reversely, an external sound is prevented from getting inside. The operability of the apparatus can thus be enhanced by the elimination of the keyed sound at the time of the keyboard operation, and a stable operation of the apparatus for detecting the keyed position can be achieved by keeping the apparatus free from the effect of the external sound.

Figure 6:
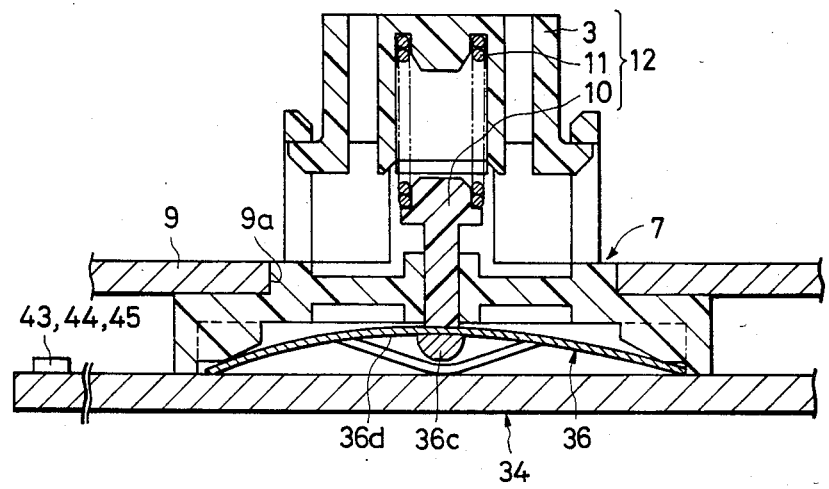
Figure 7:
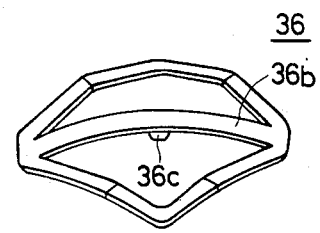

A second preferred embodiment of the invention is shown in FIGS. 6 and 7.

The difference of the second embodiment from the first embodiment is that the board 34 is made of metal, the central bridge portion 36b of the plate spring 36 is provided with a metallic tip 36c welded thereto, and first, second, and third pickups are piezoelectric devices 43, 44, 45 coupled to the board 34 so that the cover plate 5 and the sound insulating sheet 8 are not used.

When a key-top 2 is pressed down, the push element 10 is lowered via the stem 3 and the coil spring 11. The central bridge portion 36b of the plate spring 36 is thereby pushed to reverse the plate spring 36, whereby the tip 36c is caused to give a tap on the board 34. Further pressing on the key-top 2 is adapted to compress the coil spring 11 and cause a better tapping to be effected. The impulse wave (keyed signal) then produced is propagated through the board 34 to be sensed by the piezoelectric devices 43, 44, 45. After the sensing by these devices, the process is the same as in the earlier described embodiment. In the present case, the propagation velocity is larger than that in the first embodiment since the keyed siganl propagates through the board 34 and the detection speed of the keyed position can be increased accordingly, and the response to the operation thereof by an operator can be improved considerably.

Other points concerning structure and functioning of the second embodiment are the same as those of the first embodiment, and therefore description of the same is omitted here.

Figure 8:
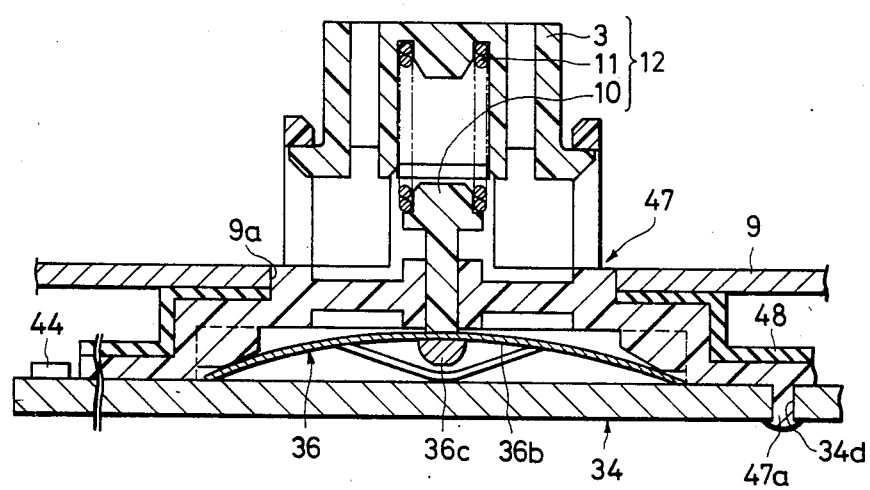
FIG. 8 is a cross-sectional view showing a third preferred embodiment of the invention and corresponding to FIG. 6.

A third preferred embodiment is shown in FIG. 8.

This embodiemnt is different from the second embodiment in that, while a plurality of frame members 7 were provided for the second embodiment, the frame member 47 here is an integral body made of a synthetic resin such as ABS or polyacetal corresponding to the plurality of frame members 7, and the frame member 47 is provided with a plurality of protruded portions 47a, which protruded portions 47a are inserted in the holes 34d in the board 34 and fixed thereto by heat caulking or the like, and, further, a sound insulating sheet 48 of a rubber sheet or the like is provided here.

By the arrangement as described above, a large number of the frame members 7 which were provided for the earlier described embodiment can be replaced with a single part in the present embodiment, which facilitates production and assembling. And, since a sound insulating sheet 48 is provided herein, the advantage with regard to sound insulation the same as in the first embodiment can be obtained.

Since other points concerning structure and functioning are the same as the second embodiment, the description of the same is omitted here.

While in the above described embodiments the plate spring 6, 36 was used as the elastic member, this is not to be limited to the plate spring, but other means which produce a sound when pushed by a push member or causes an impulse wave to be produced by tapping on the board 4, 34 will equally be used.

The apparatus of the present invention as so far described is capable of detecting the keyed position by a noncontact method without the need for the movable and fixed contacts, and therefore the apparatus is hardly affected by dirt or the like and provides a highly reliable operability, and since the number of component parts used therein is decreased, it also provides a practical effect that the production cost can be reduced.

What we claim is:

1. A keyboard apparatus comprising:
    a lower board extending over a keyboard area;
    a plate member mounted over said lower board and spaced apart therefrom by a gap so as to form an air channel between said plate member and said board, said plate member having a plurality of openings formed therein over the keyboard area;
    a plurality of acoustic signal generating means each mounted over a respective one of said openings in said plate member, and a corresponding plurality of push members each disposed above a respective one of said signal generating means and having a downwardly depressable push element for pushing on the respective signal generating means so as to produce an acoustic signal in response to actuation of the push member;
    an upper board mounted over said plate member and said plurality of signal generating means having a plurality of openings through which the respective push members project externally so as to be actuable by an operator;
    at least three pickups disposed on said lower board at different positions around the periphery of the keyboard area and in communication with said air channel for sensing an acoustic signal produced by actuation of a push member to push a respective one signal generating means at a location in the keyboard area which propagates through said air channel;
    a detecting circuit connected to said pickups for detecting the location of said actuated push member in response to the outputs from said pickups based upon the difference in arrival times of the acoustic signal at each of said pickups.

2. A keyboard apparatus as claimed in claim 1, wherein a sound absorbing sheet is mounted between said upper board and over said plate member for absorbing sound and external vibrations.

3. A keyboard apparatus comprising:
    a lower board extending over a keyboard area;
    a plurality of deformable elastic members mounted in respective locations in the keyboard area on said lower board, and a corresponding plurality of push members each disposed above a respective one of said elastic members and having a downwardly depressable push element for pushing on the respective elastic member so as to deform it and cause it to produce an acoustic sound against said lower board in response to actuation of the push member;
    an upper board mounted over said lower board and said elastic members having a plurality of openings through which the respective push members project externally so as to be actuable by an operator;
    at least three pickups disposed on the lower board at different positions around the periphery of the keyboard area and in communication with said lower board for sensing an acoustic sound produced by actuation of a push member to push a respective elastic member at a location in the keyboard area which propagates through said lower board;
    determining means connected to said pickups for determining the location of said actuated push member in response to the outputs from said pickups based upon the differences in arrival times of the acoustic signal at each of said pickups.

4. A keyboard according to claim 3 wherein said elastic members each comprises a monostable click member which produces a click when it is deformed.

5. A keyboard according to claim 4 further comprising a spring linked to each said click member for deforming the click member when one end of the spring is depressed.

6. A keyboard according to claim 3 wherein said pickup positions are selected so that a generated acoustic signal does not arrive at all pickups at the same time.

7. A keyboard according to claim 3 wherein said determining means comprises a plurality of counters, means for resetting the counters when an acoustic signal is first detected, and means for stopping each of said counters when the acoustic signal is detected by a respective one of said pickups.

8. A keyboard according to claim 3 wherein said determining means includes
    memory means for storing characteristic data representing the signal propagation time from each signal generating means to the pickups; and
    comparison means for comparing characteristic data in the memory means against the arrival time differences of a signal generated by one of said plurality of signal generating means.

9. A keyboard apparatus as claimed in claim 3, further comprising a single molded frame member mounted on said lower board having a plurality of openings for mounting said elastic members in their respective locations of said lower board.

10. A keyboard apparatus as claimed in claim 9, wherein a sound absorbing sheet is mounted between said upper board and over said frame member for absorbing sound and preventing it from being propagated externally.

11. A keyboard apparatus as claimed in claim 3, wherein said lower board is a metal plate.

12. A keyboard apparatus as claimed in claim 3, wherein said elastic members each comprises a plate spring formed by a supporting loop portion and a curved center bridge portion which is deformable by a push member so as to snap downward and produce a click sound.

* * * * *